(12) United States Patent
Chiu et al.

(10) Patent No.: US 12,368,086 B2
(45) Date of Patent: Jul. 22, 2025

(54) PACKAGE STRUCTURE HAVING THERMOELECTRIC COOLER

(71) Applicant: Taiwan Semiconductor Manufacturing Company, Ltd., Hsinchu (TW)

(72) Inventors: Chao-Wei Chiu, Hsinchu (TW); Chao-Wei Li, Hsinchu (TW); Hsiu-Jen Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 18/152,131

(22) Filed: Jan. 9, 2023

(65) Prior Publication Data

US 2024/0096740 A1    Mar. 21, 2024

Related U.S. Application Data

(60) Provisional application No. 63/407,176, filed on Sep. 16, 2022.

(51) Int. Cl.
| | | |
|---|---|---|
| *H01L 23/38* | (2006.01) | |
| *H01L 23/48* | (2006.01) | |
| *H01L 23/498* | (2006.01) | |
| *H10N 10/82* | (2023.01) | |

(52) U.S. Cl.
CPC ............ *H01L 23/38* (2013.01); *H01L 23/481* (2013.01); *H01L 23/49816* (2013.01); *H10N 10/82* (2023.02)

(58) Field of Classification Search
CPC . H01L 23/38; H01L 23/481; H01L 23/49816; H10N 10/82
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |

(Continued)

FOREIGN PATENT DOCUMENTS

| | | | |
|---|---|---|---|
| KR | 2015007827 A | * 1/2015 | ............... H05K 7/20 |
| TW | 201642409 | 12/2016 | |
| TW | 202212427 | 4/2022 | |

OTHER PUBLICATIONS

KR-2015007827-A English machine translation (Year: 2015).*

(Continued)

*Primary Examiner* — Andrew J Golden
(74) *Attorney, Agent, or Firm* — JCIPRNET

(57) ABSTRACT

Provided is a package structure including a first redistribution layer (RDL) structure, a die, a circuit substrate, and a first thermoelectric cooler. The RDL) structure has a first side and a second side opposite to each other. The die is disposed on the first side of the first RDL structure. The circuit substrate is bonded to the second side of the first RDL structure through a plurality of first conductive connectors. The first thermoelectric cooler is between the first RDL structure and the circuit substrate, wherein the first thermoelectric cooler includes at least a N-type doped region and at least a P-type doped region.

20 Claims, 16 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0086487 A1* | 4/2006 | Yang | H01L 23/433 257/E23.09 |
| 2010/0163090 A1* | 7/2010 | Liu | H10N 10/17 136/224 |
| 2010/0219525 A1* | 9/2010 | Ibaraki | H10N 10/17 257/693 |
| 2013/0192655 A1* | 8/2013 | Edwards | H01L 23/38 136/200 |
| 2016/0334845 A1* | 11/2016 | Mittal | H01L 23/38 |
| 2017/0117261 A1* | 4/2017 | Yu | H01L 23/498 |
| 2017/0345807 A1* | 11/2017 | Yu | H01L 23/3157 |
| 2018/0005917 A1* | 1/2018 | Tang | H01L 23/49811 |
| 2019/0074237 A1* | 3/2019 | Beauchemin | H01L 23/38 |
| 2019/0131209 A1* | 5/2019 | Woods | H01L 23/49827 |
| 2019/0273029 A1* | 9/2019 | Tuttle | H01L 23/38 |
| 2019/0333836 A1* | 10/2019 | Lin | H01L 23/49816 |
| 2020/0105639 A1* | 4/2020 | Valavala | H10N 10/17 |
| 2020/0286814 A1* | 9/2020 | Mahajan | H01L 23/34 |
| 2020/0395313 A1* | 12/2020 | Mallik | H01L 21/4853 |
| 2021/0043543 A1* | 2/2021 | Eid | H10N 10/17 |
| 2022/0199482 A1* | 6/2022 | Chiu | H10N 10/17 |
| 2022/0209094 A1* | 6/2022 | Murata | H10N 10/13 |
| 2022/0262783 A1* | 8/2022 | Yu | H01L 24/16 |

OTHER PUBLICATIONS

Theil et al "Recent Developments in Fine Pitch Wafer-To-Wafer Hybrid Bonding with Copper Interconnect," 2019 International Wafer Level Packaging Conference (IWLPC), San Jose, CA, USA, 2019, pp. 1-6 (Year: 2019).*

"Office Action of Taiwan Counterpart Application", issued on Feb. 27, 2024, p. 1-p. 5.

* cited by examiner

PACKAGE STRUCTURE HAVING THERMOELECTRIC COOLER

CROSS-REFERENCE TO RELATED APPLICATION

This application claims the priority benefit of U.S. provisional application Ser. No. 63/407,176, filed on Sep. 16, 2022. The entirety of the above-mentioned patent application is hereby incorporated by reference herein and made a part of this specification.

BACKGROUND

Electronic equipment using semiconductor devices is essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS), integrated fan out (InFO) package, package on package (PoP) and three-dimensional integrated circuit (3DIC) are widely implemented to integrate or stack several chips to become a single semiconductor device.

Fabrication of the semiconductor device involves many steps and operations on such a small and thin semiconductor device. Therefore, the manufacturing of the semiconductor device in a miniaturized scale becomes more complicated. Further, more different components with different materials are involved, which implies a demand on thermal management and heat dissipation efficiency due to high power density of the semiconductor device.

As such, there are many challenges for modifying a structure of the semiconductor device and improving the manufacturing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
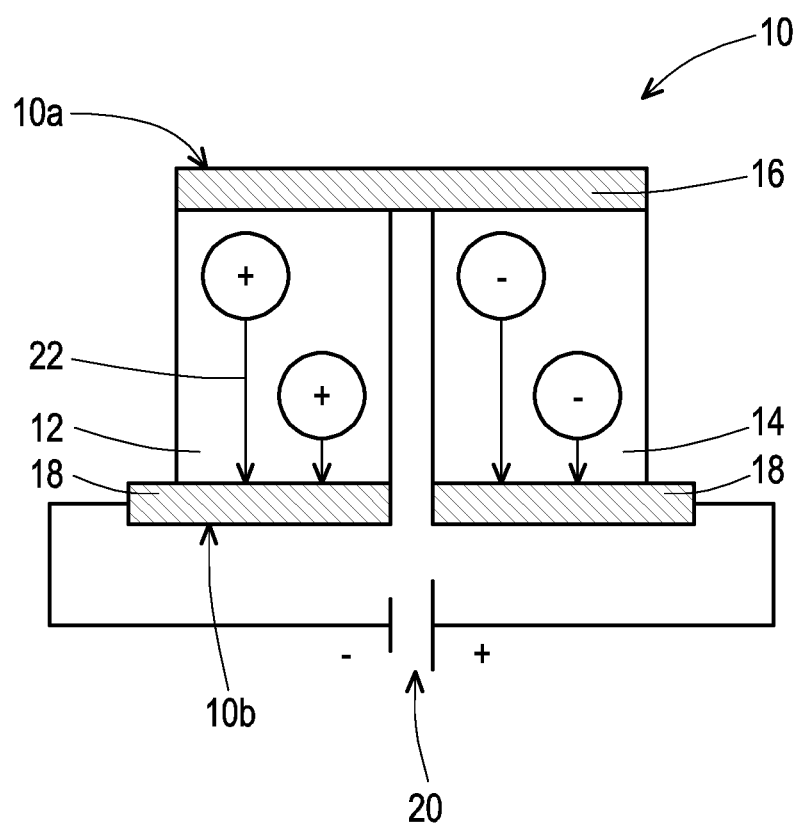
FIG. 1 is a simplified block diagram of a thermoelectric cooler in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In traditional semiconductor packages, a heat sink typically comprises a metal structure with a first surface in thermal contact with the semiconductor components to be cooled. A second surface of the metal structure typically includes a series of fins, protrusions, or comb-like structures to increase the metal structure's surface area, thus increasing the rate of heat transfer from the metal structure to the surrounding atmosphere.

Although these traditional means of cooling semiconductors have been applied to the semiconductor packages, the heat spreading route is limited as the stacking density of the semiconductor packages increases. The traditional method of cooling is passive—heat passively flows out of the interior dies to the heat spreaders, which can lead to unacceptably high temperatures in the interior of the semiconductor packages.

The present disclosure provides a thermoelectric cooler for actively cooling the package structure. The said thermoelectric cooler may be applied on various package structures to actively remove heat generated by the logic die used for high-speed calculation, thereby improving the performance and reliability of the package structures. A method of cooling the package structure is also provided, comprising monitor a temperature of an internal hotspot of the package structure by a temperature sensor; activating a thermoelectric cooler through a regulator when the monitored temperature of the internal hotspot is greater than or equal to a first setpoint; and deactivating the thermoelectric cooler through the regulator when the monitored temperature of the internal hotspot is less than a second setpoint.

FIG. 1 is a simplified block diagram of a thermoelectric cooler 10 in accordance with some embodiments. The thermoelectric cooler 10 is also known in the art as a Peltier cooler. The thermoelectric cooler 10 is a solid-state active heat pump. The term "thermoelectric cooler" is sometimes abbreviated in the art as "TEC".

Referring to FIG. 1, the thermoelectric cooler 10 may include at least one P-type doped region 12 and at least one N-type doped region 14 connected to each other in series by using a trace 16. In addition, a power source 20 provides electrical power to a pair of electrical connections 18. When the voltage is applied across the P-type doped region 12 and the N-type doped region 14, a temperature gradient is formed between a first side 10a and a second side 10b opposite to the first side 10a of the thermoelectric cooler 10. Specifically, when the voltage is applied across the P-type doped region 12 and the N-type doped region 14, the holes in the P-type doped region 12 drift in the same direction 22 as the electrons in the N-type doped region 14, i.e., from the top to the bottom of the thermoelectric cooler 10. In this case, the holes and the electrons may serve as a refrigerant to actively dissipate the heat generated by the logic die (not shown). In some embodiments, the first side 10a may be referred to as a cold side, while the second side 10b may be referred to as a hot side. In some embodiments, the hotspot is thermally coupled to or near the cold side 10a for heat dissipation through the thermoelectric cooler 10.

Figure 2:
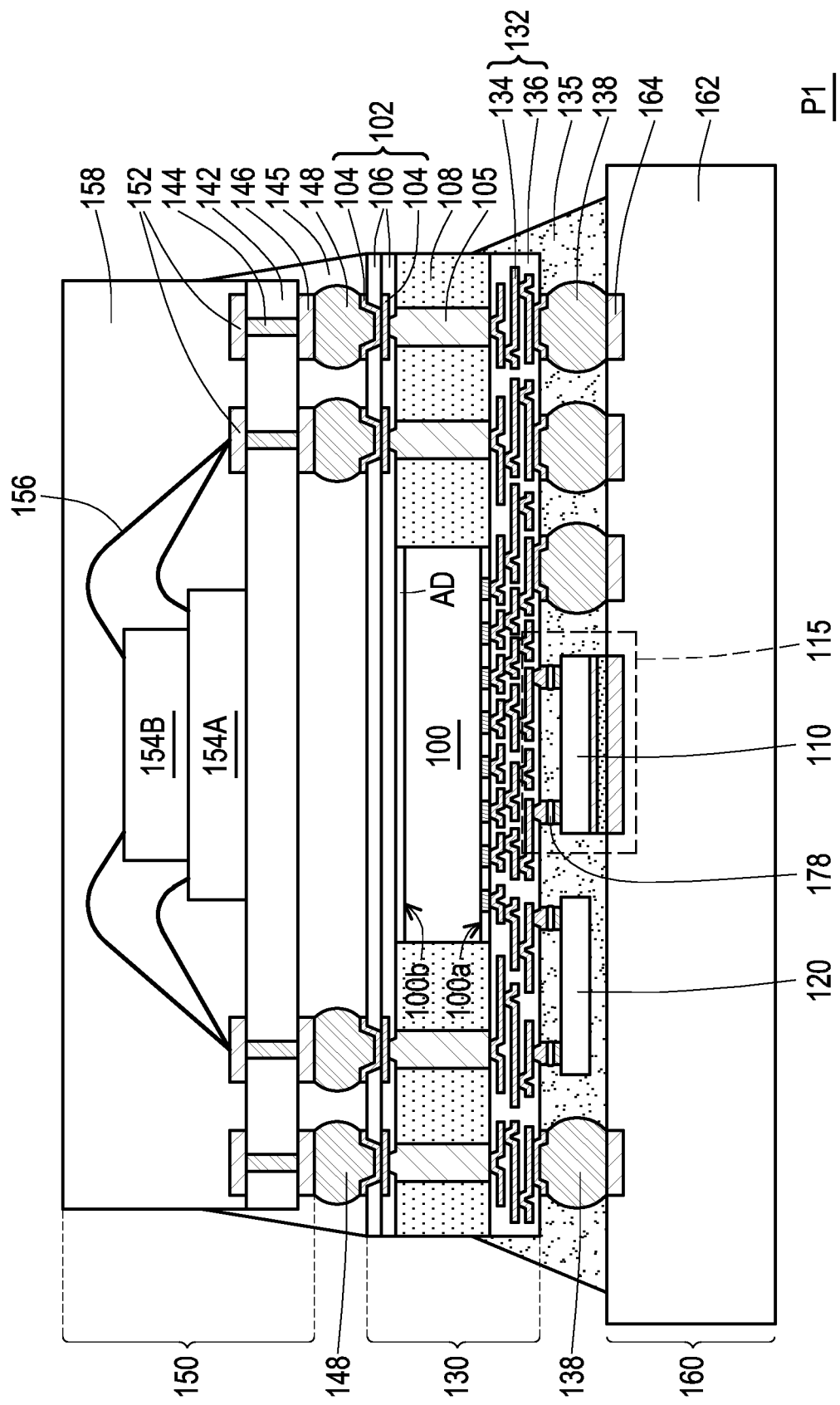
FIG. 2 is a cross-sectional view of a package structure in accordance with a first embodiment.
Figure 3A:
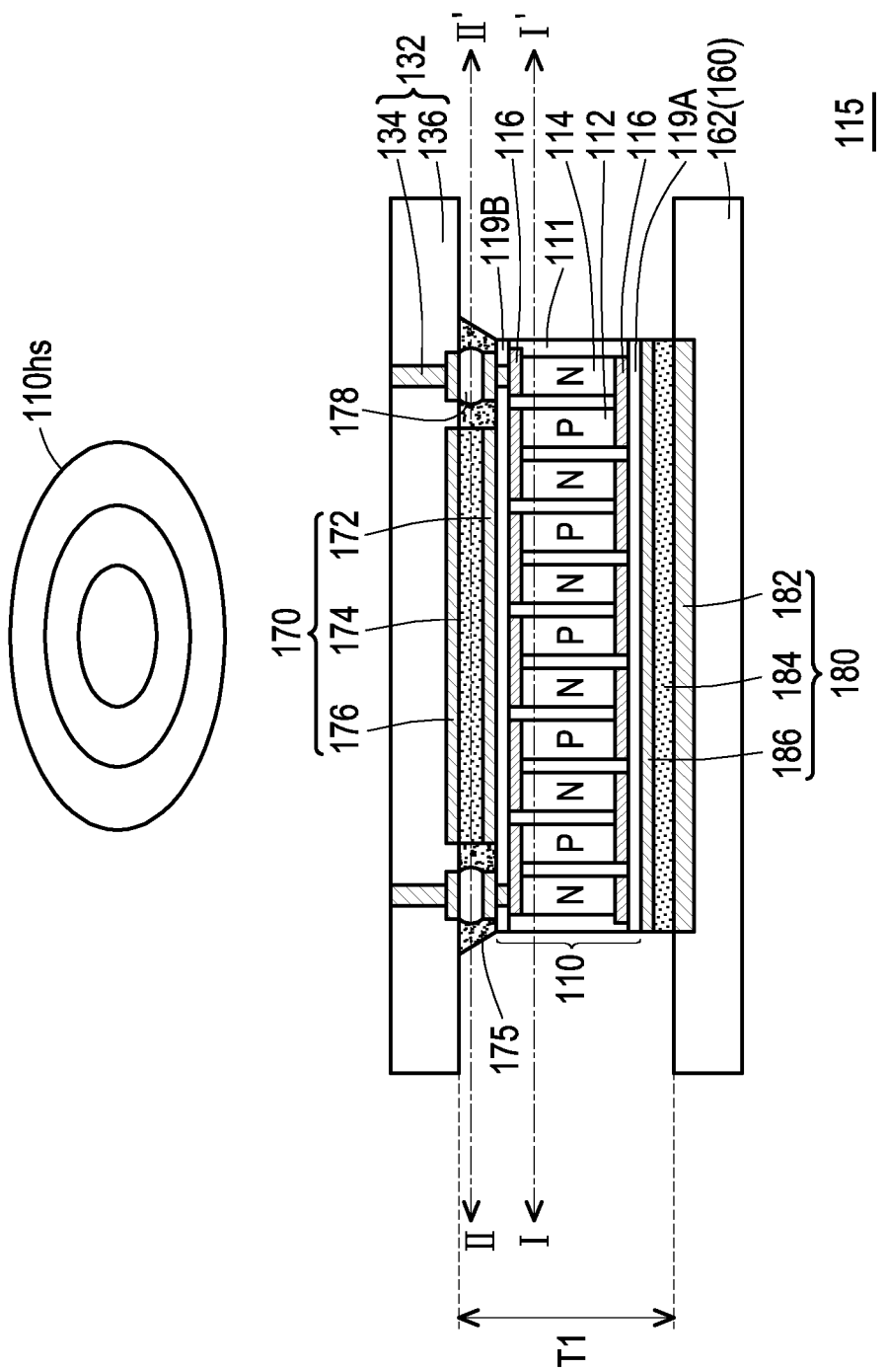
FIG. 3A is an enlarged view of a region of FIG. 2.
Figure 3B:
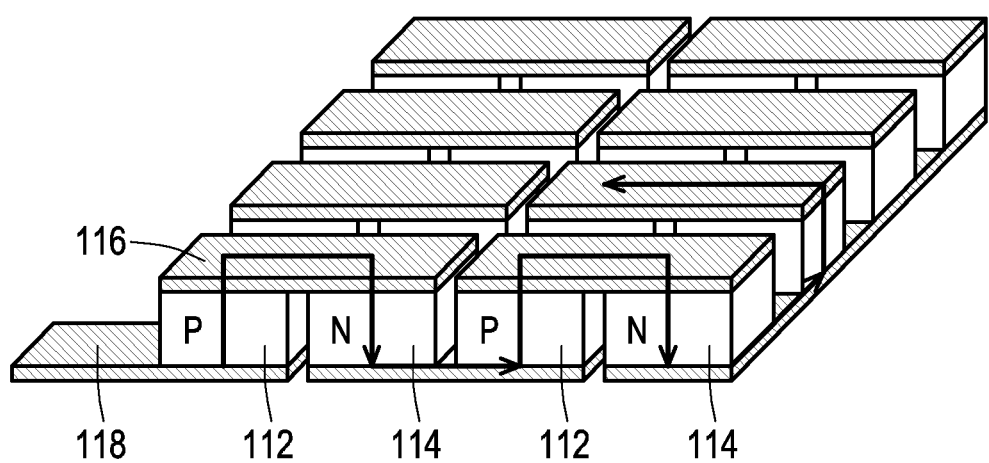
FIG. 3B is a perspective view of a thermoelectric cooler of FIG. 3A.
Figure 3C:
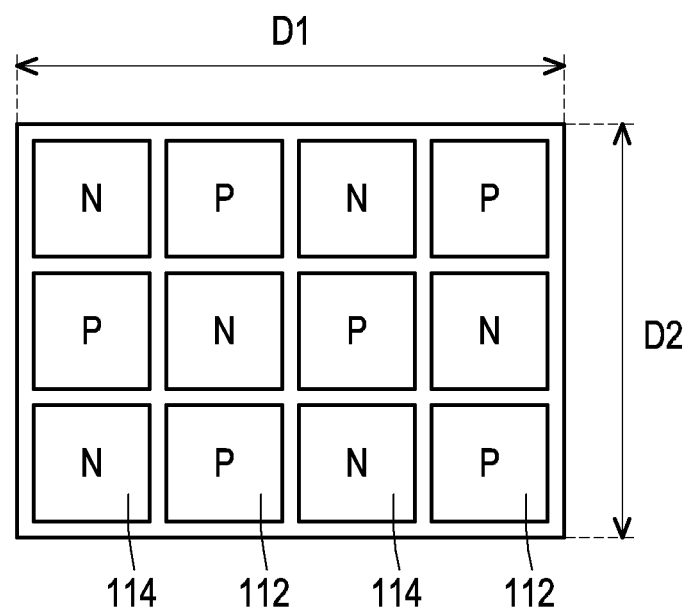
FIG. 3C is a top view of a thermoelectric cooler of FIG. 3A taken along the line I-I in accordance with some embodiments.

FIG. 2 is a cross-sectional view of a package structure P1 in accordance with a first embodiment. FIG. 3A is an enlarged view of a region 115 of FIG. 2. FIG. 3B is a perspective view of a thermoelectric cooler 110 of FIG. 3A. FIG. 3C is a top view of a thermoelectric cooler 110 of FIG. 3A taken along the line I-I in accordance with some embodiments.

Referring to FIG. 2, a package structure P1 may include a first package component 130 and a second package component 150 stacked on a circuit substrate 160. Herein, the package structure P1 may be referred to as a package-on-package (PoP) structure. In some embodiments, the first package component 130 includes a die 100, a plurality of through insulator vias (TIVs) 105, an encapsulant 108, a first redistribution layer (RDL) structure 132, and a second RDL structure 102. The die 100 may be formed between the first RDL structure 132 and the second RDL structure 102. In some embodiments, the die 100 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the die 100 includes a memory die such as high bandwidth memory (HBM) die. Although only one die 100 is illustrated in FIG. 2, the embodiments of the present invention are not limited thereto. In alternative embodiments, one or more dies are sandwiched between the first RDL structure 132 and the second RDL structure 102.

In detail, the die 100 includes a front side (or an active surface) 100a and the backside 100b opposite to each other. The front side 100a of the die 100 faces down and toward the first RDL structure 132, while the backside 100b of the die 100 faces up and toward the second RDL structure 102. Herein, the first RDL structure 132 may be referred to as a front side RDL (FSRDL) structure, and the second RDL structure 102 may be referred to as a backside RDL (BSRDL) structure. The die 100 may be adhered on the second RDL structure 102 through an adhesive layer AD such as a die attach film (DAF), silver paste, or the like. In the case, the backside 100b of the die 100 is in contact with the adhesive layer AD, so that the adhesive layer AD is disposed between the die 100 and the RDL structure 102.

In some embodiments, the second RDL structure 102 may include a plurality of conductive features 104 embedded in a dielectric layer 106. The dielectric layer 106 may be a single layer or a multilayer structure, for example. In some embodiments, a material of the dielectric layer 106 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes a photosensitive material, a non-photosensitive material, or a combination thereof. In some embodiments, the photosensitive material includes polybenzoxazole (PBO), polyimide, benzocyclobutene (BCB), positive photoresist, negative photoresist, a combination thereof, and/or the like. The non-photosensitive material includes Ajinomoto buildup film (ABF). The dielectric layer 106 may be formed by chemical vapor deposition, spin coating, or lamination. In some embodiments, the conductive features 104 includes a plurality of traces and vias (not shown) stacked alternately. The conductive features 104 is formed by following steps including forming a seed layer (not shown) on the dielectric layer by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the conductive features 104 may include the conductive material and underlying seed layer. In some embodiments, the conductive features 104 may be made of conductive materials with low resistivity, such as copper (Cu), aluminum (Al), Cu alloys, Al alloys, or other suitable materials.

The first RDL structure 132 may include a plurality of conductive features 134 embedded in a dielectric layer 136. In some embodiments, the conductive features 134 include a plurality of traces and vias (not shown) stacked alternately. The material and forming method of the conductive features 134 and the dielectric layer 136 are similar to the material and forming method of the conductive features 104 and the dielectric layer 106 illustrated in above embodiments. Thus, details thereof are omitted here.

As shown in FIG. 2, the die 100 may be laterally encapsulated by the encapsulant 108. In some embodiments, the encapsulant 108 includes a molding compound, a molding underfill, a resin (such as an epoxy resin), or a combination thereof, or the like. The said molding compound may include a plurality of silica filler materials in a polymer base material. The encapsulant 108 may be formed by a sequence of an over-molding process and a planarizing process such as chemical mechanical polishing (CMP) process.

The TIVs 105 may be formed aside the die 100 and laterally encapsulated by the encapsulant 108. In some embodiments, the TIVs 105 surround the die 100 in a plan view. The TIVs 105 may penetrate through the encapsulant 108 to contact the first RDL structure 132 and the second RDL structure 102. In this case, the TIVs 105 may be electrically connect the first RDL structure 132 and the second RDL structure 102. In some embodiments, the TIVs 105 are formed by photolithography, plating, and photoresist stripping process. For example, the TIVs 105 include copper posts. The TIVs 105 may be formed by following steps including forming a seed layer (not shown) on the second RDL structure 102 by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the TIVs 105 may include the conductive material and underlying seed layer. In some alternative embodiments, the TIVs 105 are obtained by the manufacturer may be mounted on the second RDL structure 102. In some embodiments, the TIV 105 has a concave sidewall in a cross-sectional view. That is, an interface between the TIV 105 and the encapsulant 108 is curved in a cross-sectional view.

In some embodiments, the package structure P1 further includes a thermoelectric cooler 110 and a passive device 120. The thermoelectric cooler 110 and the passive device 120 may be disposed side by side between the bottom surface of the first RDL structure 132 and the top surface of the circuit substrate 160. In some embodiments, the passive device 120 may be an integrated passive device (IPD), such as capacitors, resistors, inductors, baluns, couplers, splitters, filters, diplexers, or the like is able to be integrated in the IPD. The bottom surface of the passive device 120 and the top surface of the circuit substrate 160 are separated from each other by a non-zero distance. That is, the passive device 120 is bonded to the first RDL structure 132, while not bonded to the circuit substrate 160. Although only one passive device 120 is illustrated in FIG. 2, the embodiments of the present invention are not limited thereto. In alternative embodiments, one or more passive devices are bonded to the first RDL structure 132.

As shown in FIG. 3A, the thermoelectric cooler 110 may include a plurality of P-type doped regions 112 and a plurality of N-type doped regions 114 sandwiched between two insulating plates 119A and 119B. In some embodiments, the P-type doped regions 112 and the N-type doped regions 114 are formed in a semiconductor substrate 111 (e.g., silicon substrate) by performing one or more doping processes, such as implantation processes. In this case, the P-type doped regions 112 may be referred to as P-type semiconductor pillars and the N-type doped regions 114 may be referred to as N-type semiconductor pillars. Additional materials and design shapes can be used to construct the P-type doped regions 112 and the N-type doped regions 114. In some embodiments, the insulating plates 119A and 119B are made of ceramic, which is an effective heat conductor and an electrical insulator (e.g., beryllia, BeO). Additional materials (e.g., SiO, SiN, or the like) can be used to construct the insulating plates 119A and 119B.

The P-type doped regions 112 and the N-type doped regions 114 may be connected to each other in series by using a plurality of traces 116. As shown in FIG. 3B and FIG. 3C, the P-type doped regions 112 and the N-type doped regions 114 may be arranged in a checkerboard pattern or two-dimensional array. As shown in FIG. 3C, the thermoelectric cooler 110 has a first dimension D1 and a second dimension D2. In some embodiments, the first dimension D1 may be in a range of 0.5 mm to 1.5 mm, and the second dimension D2 may be in a range of 0.5 mm to 1.5 mm. However, the embodiments of the present invention are not limited thereto. The first dimension D1 and the second dimension D2 may be adjusted based on chip design. In addition, a power source (not shown) provides electrical power to a pair of electrical connections 118. In some embodiments, the traces 116 and the electrical connections 118 include copper. In other embodiments, the traces 116 and the electrical connections 118 include another electrically conductive material.

The thermoelectric cooler 110 may be bonded to the bottom surface of the first RDL structure 132 by two joints 178. The joints 178 may be electrically connected to the electrical connections 118 of the thermoelectric cooler 110 for providing the electrical power. In some embodiments, the joints 178 may include solder bumps, gold bumps, copper bumps, copper posts, copper pillars with solder caps, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc.

Figure 3D:
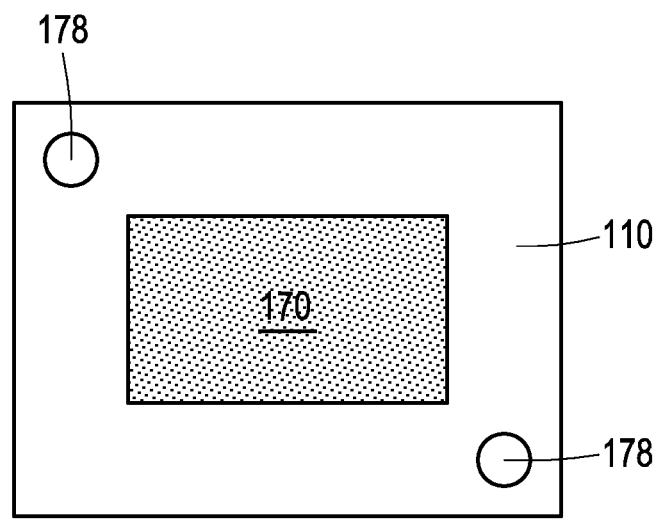
FIG. 3D is a top view of a thermoelectric cooler of FIG. 3A taken along the line II-II in accordance with some embodiments.

In addition, the thermoelectric cooler 110 may be bonded to the bottom surface of the first RDL structure 132 by an adhesive structure 170. As shown in FIG. 3A, the thickness T1 of the thermoelectric cooler 110 may be less than or substantially equal to the distance between the bottom surface of the first RDL structure 132 and the top surface of the circuit package 160. In some embodiments, the thickness T1 of the thermoelectric cooler 110 may be in a range of 0.08 mm to 0.15 mm. The adhesive structure 170 may be laterally disposed between the joints 178. As shown in the top view of FIG. 3D, the joints 178 may be respectively disposed at two corners of a perimeter of the thermoelectric cooler 110, and are arranged in a diagonal direction. In this case, one jointer 178 can be as far away from another jointer 178 as possible to provide a maximum area to accommodate the adhesive structure 170 for heat dissipation. Specifically, the adhesive structure 170 may include a thermal interface material (TIM) 174 sandwiched between two metal layers 172 and 176. In some embodiments, the TIM 174 is formed from a material with higher thermal conductivity (k), such as Ag, Cu, Sn, In, carbon nanotube (CNT), graphite, or the like. In some embodiments, the thermal conductivity (k) of the TIM 174 is from about 0.5 $Wm^{-1}K^{-1}$ to about 200 $Wm^{-1}K^{-1}$, or from about 10 $Wm^{-1}K^{-1}$ to about 50 $Wm^{-1}K^{-1}$, such as about 20 $Wm^{-1}K^{-1}$. In some alternative embodiments, the TIM 174 is formed from another material, such as a polymer material, solder paste, indium solder paste, or the like. In some embodiments, the metal layers 172 and 176 may be formed from a conductive material or metal, such as Ag, Au, Ti, NiV, Al, TiN, Cu, Sn, the like, or a combination thereof. In some embodiments, the metal layers 172 and 176 are electrically floating. That is, the metal layers 172 and 176 may be electrically insulated from the active and/or passive devices of the die 100 and other surrounding devices.

Figure 5:
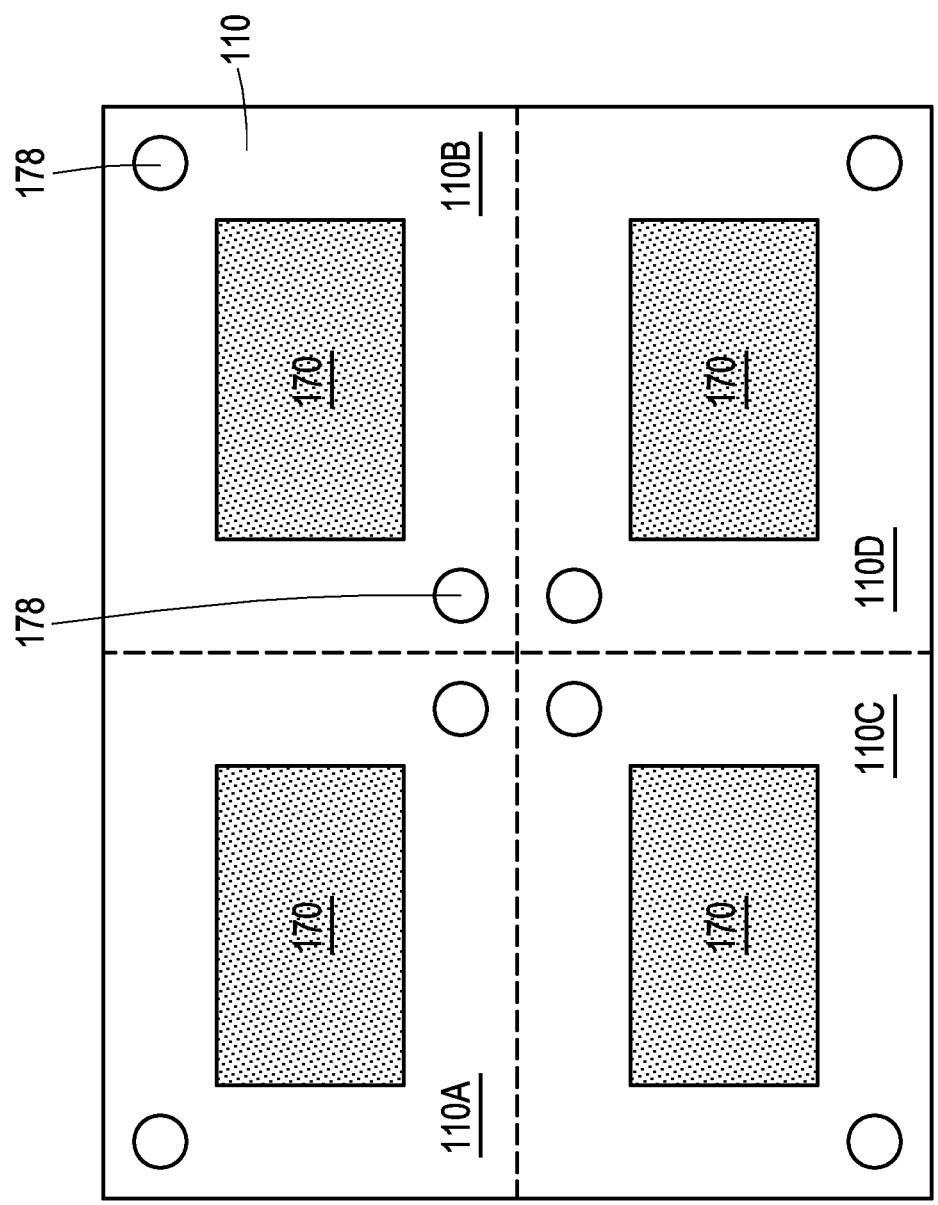
FIG. 5 is a top view of a thermoelectric cooler of FIG. 3A taken along the line II-II in accordance with some alternative embodiments.

FIG. 5 illustrates a top view of the thermoelectric cooler 110 of FIG. 3A taken along the line II-II in accordance with some alternative embodiments.

In some alternative embodiments, as shown in FIG. 5, the area of the thermoelectric cooler 110 may be divided into four regions 110A, 110B, 110C, and 110D. Each of the regions 110A, 110B, 110C, and 110D may have the joints 178 and the adhesive structure 170 between the joints 178. In such embodiment, each of the regions 110A, 110B, 110C, and 110D may apply various voltages across a corresponding set of the P-type doped regions 112 and the N-type doped regions 114 through a pair of the joints 178 to actively adjust the temperature of the corresponding region. For example, the region 110A may apply a first voltage to form a first temperature gradient in the region 110A, and the region 110B may apply a second voltage greater than the first voltage to form a second temperature gradient in the region 110B. In this case, the cooling effect of the region 110B may be greater than the cooling effect of the region 110A. That is, by applying different voltages through different pair of the joints 178, the temperature of the local area of the thermoelectric cooler 110 may be adjusted by zones in accordance with the embodiments.

Referring back to FIG. 3A, an underfill layer 175 may be formed to laterally encapsulate the joints 178, the TIM 174, and the metal layer 172. In some embodiments, the underfill layer 175 may be any acceptable material, such as a polymer, epoxy, molding underfill, or the like. The underfill layer 175 may be formed by a capillary flow process after the joints 178 is attached or may be formed by a suitable deposition method before the joints 178 is attached. The underfill layer 175 may have a curved sidewall.

On the other hand, the thermoelectric cooler 110 may be bonded to the top surface of the circuit substrate 160 by an adhesive structure 180. Specifically, the adhesive structure 180 may include a thermal interface material (TIM) 184 sandwiched between two metal layers 182 and 186. The material and forming method of the adhesive structure 180 are similar to the material and forming method of the adhesive structure 170 illustrated in above embodiments. Thus, details thereof are omitted here.

It should be noted that when the voltage is applied across the P-type doped regions 112 and the N-type doped regions 114, a temperature gradient is formed between the insulating plates 119A and 119B of the thermoelectric cooler 110. That is, the insulating plate 119B of the thermoelectric cooler 110 is cooled and the insulating plate 119A of the thermoelectric cooler 110 is heated, so that the heat generated by the die 100 (FIG. 2) is transferred out, thereby reducing the temperature of an internal hotspot 110hs. In this case, a temperature of the insulating plate 119B of the thermoelectric cooler 110 lower than a temperature of the insulating plate 119A of the thermoelectric cooler 110. In such embodiment, the insulating plate 119B may be referred to as a cold side, while the insulating plate 119A may be referred to as a hot side.

In addition, the adhesive structure 170 is thermally coupled between the first RDL structure 132 and the thermoelectric cooler 110. In such embodiment, the adhesive structure 170 may further transfer the heat generated by the die 100 to reduce the temperature of the internal hotspot 110hs for heat dissipation. Further, the adhesive structure 180 is thermally coupled between the thermoelectric cooler 110 and the circuit substrate 160. The heat from the internal hotspot 110hs may initiatively flow to the circuit substrate 160 through the adhesive structure 170, the thermoelectric cooler 110 and the adhesive structure 180. Referring back to FIG. 2, a projected area of the thermoelectric cooler 110 projected on the circuit substrate 160 may fall within a projected area of the die 100 projected on the circuit substrate 160. That is, the thermoelectric cooler 110 is directly under the die 100 and within the range of the perimeter of the die 100. In such embodiment, the thermal coupling area between the thermoelectric cooler 110 and the die 100 may be maximized, thereby optimizing the heat dissipation efficiency.

FIG. 4A to FIG. 4H illustrate cross-sectional views of forming the thermoelectric cooler 110 in accordance with some embodiments.

Figure 4A:
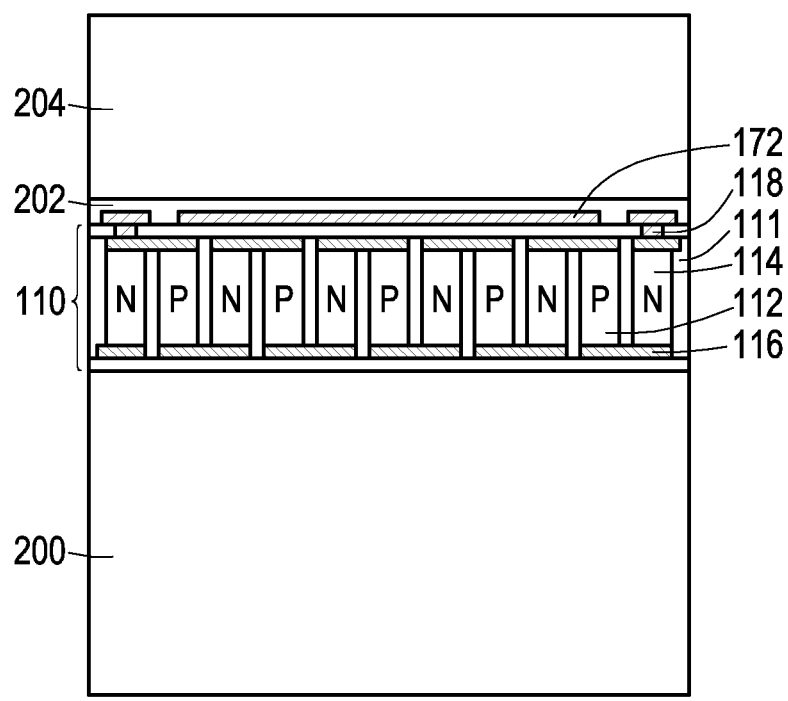
FIG. 4A to FIG. 4H are cross-sectional views of forming a thermoelectric cooler in accordance with some embodiments.

Referring to FIG. 4A, a substrate 200 (e.g., silicon substrate) is provided. The thermoelectric cooler 110 including the P-type doped regions 112 and the N-type doped regions 114 may be formed on the substrate 200 by performing one or more doping processes, such as implantation processes. After forming the thermoelectric cooler 110, a carrier 204 is bonded onto the thermoelectric cooler 110 by a de-bonding layer 202. In some embodiments, the carrier 204 is a glass substrate, and the de-bonding layer 202 is a light-to-heat conversion (LTHC) release layer formed on the glass substrate, for example. In alternative embodiments, the de-bonding layer 202 may be a photo-curable release film whose viscosity is decreased by photo-curing process or a thermal curable release film whose viscosity is decreased by thermal-curing process.

Figure 4B:
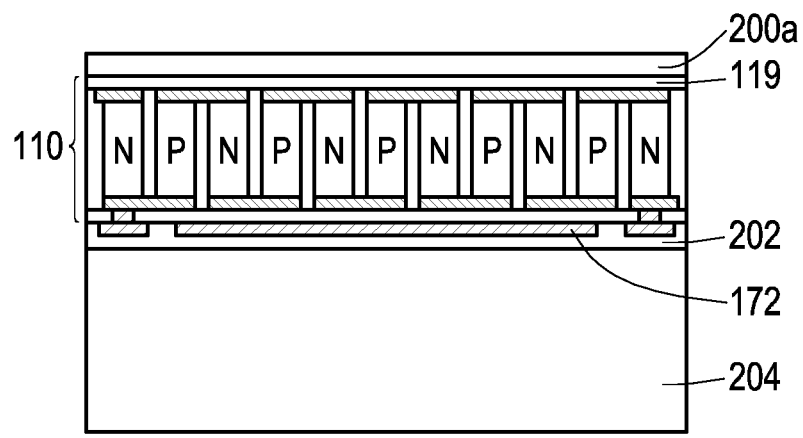

Referring to FIG. 4A and FIG. 4B, the structure illustrated in FIG. 4A is flipped, so that the substrate 200 faces up. Next, the substrate 200 is thinned by a grinding process. After the grinding process, a thin layer 200a may remain on the thermoelectric cooler 110, as shown in FIG. 4B.

Figure 4C:
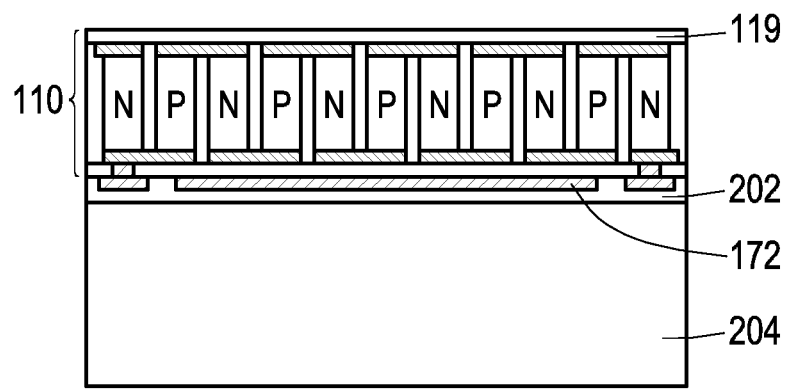

Referring to FIG. 4B and FIG. 4C, a planarizing process (e.g., CMP process) may be performed on the thin layer 200a to expose the insulating plate 119.

Figure 4D:
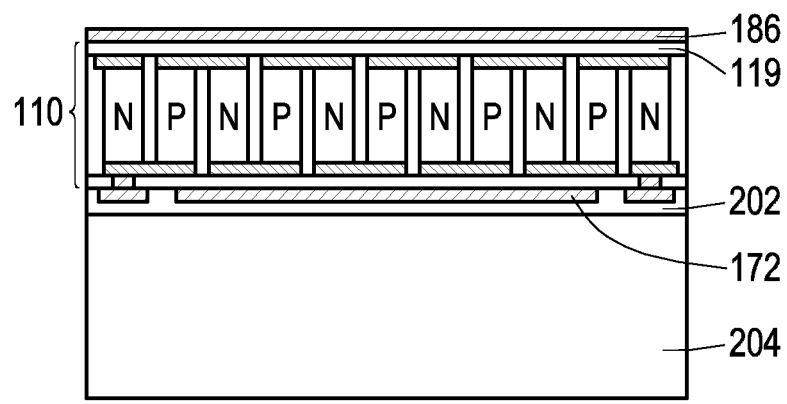

Referring to FIG. 4D, the metal layer 182 is formed on the insulating plate 119 by any suitable process such as PVD process (e.g., sputtering). In some embodiments, the metal layer 182 may be made of conductive materials with low resistivity, such as titanium (Ti), copper (Cu), aluminum (Al), Cu alloys, Al alloys, or other suitable materials. Although the metal layer 182 illustrated in FIG. 4D is a single-layered structure, the embodiments of the present invention are not limited thereto. In other embodiments, the metal layer 182 may be a bi-layered structure or multi-layered structure. For example, the metal layer 182 is a composite structure with a Ti layer and a Cu layer.

Figure 4E:
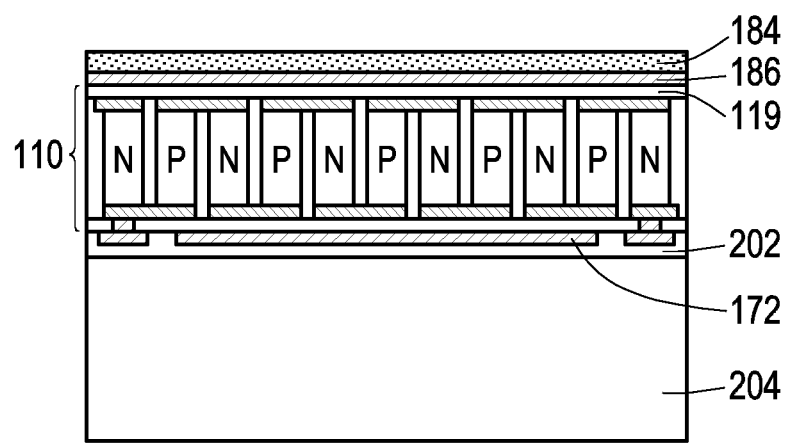

Referring to FIG. 4E, the TIM 184 is formed on the metal layer 182 by any suitable process such as plating process. In some embodiments, the TIM 184 is formed from a material with higher thermal conductivity (k), such as Ag, Cu, Sn, In, carbon nanotube (CNT), graphite, or the like. In some alternative embodiments, the TIM 184 is formed from another material, such as a polymer material, solder paste, indium solder paste, or the like.

Figure 4F:
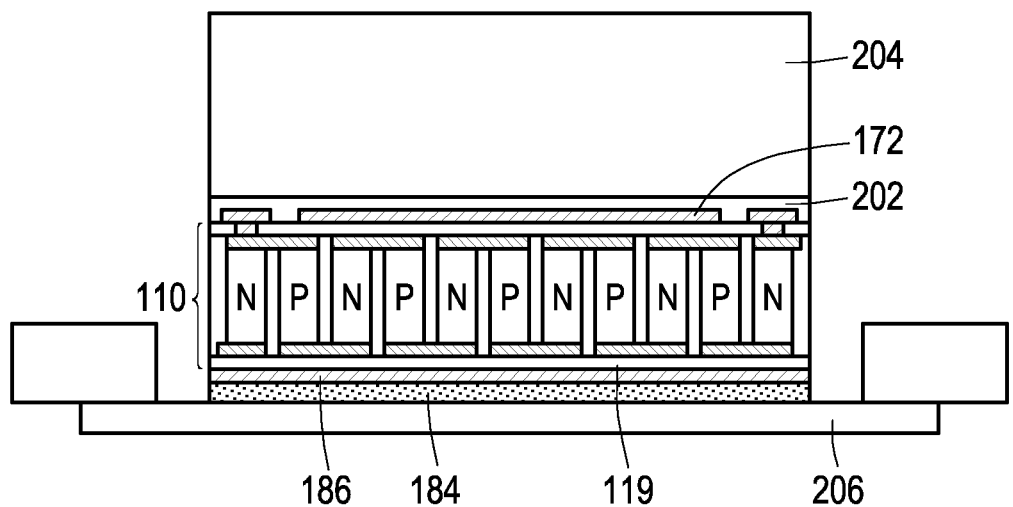
Figure 4G:
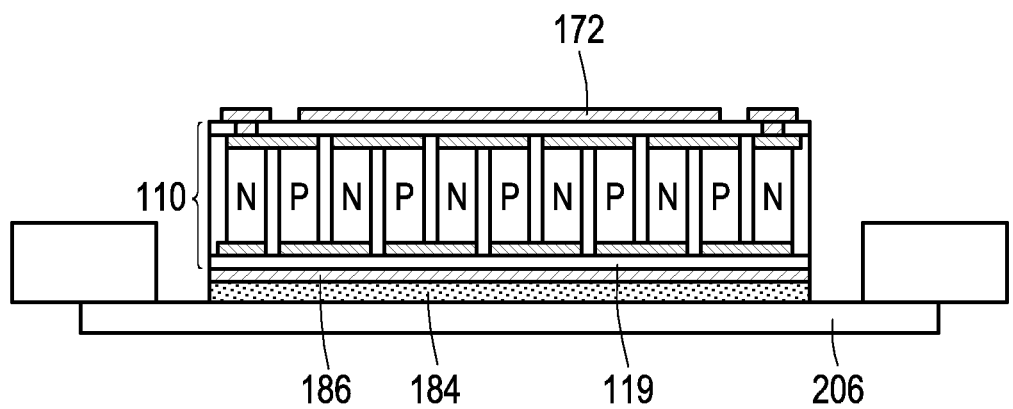

Referring to FIG. 4F and FIG. 4G, a structure illustrated in FIG. 4E is flipped and mounted on a frame 206 by the TIM 184. Next, the carrier 204 and the de-bonding layer 202 are detached from the underlying structure and then removed. In the case, as shown in FIG. 4G, the metal layer 172 is exposed. In some embodiments, the de-bonding layer 202 (e.g., the LTHC release layer) is irradiated with a UV laser so that the carrier 204 and the de-bonding layer 202 are easily peeled off from the underlying structure. Nevertheless, the de-bonding process is not limited thereto, and other suitable de-bonding methods may be used in some alternative embodiments.

Figure 4H:
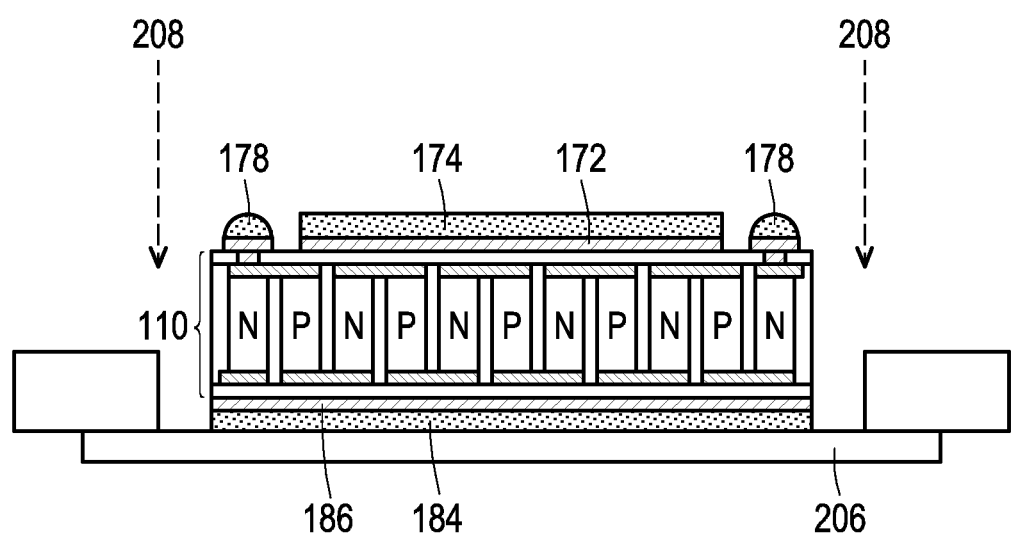

Referring to FIG. 4H, the joints 178 is formed on the thermoelectric cooler 110 and the TIM 174 is formed on the metal layer 172. In some embodiments, the joints 178 and the TIM 174 may be formed in the same step. In some alternative embodiments, the joints 178 and the TIM 174 may be formed sequentially. Then, a singulation process is performed by sawing along scribe line regions 208. Afterwards, the singulated thermoelectric cooler 110 may be bonded to the first RDL structure 132 through the joints 178 and the adhesive structure 170 (including the TIM 174 and the metal layer 172), as shown in FIG. 2.

Referring back to FIG. 2, the circuit substrate 160 may include a substrate core 162 and bond pads 164 over the substrate core 162. The substrate core 162 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 162 may be an SOI substrate. Generally, an SOI substrate includes a layer of a semiconductor material such as epitaxial silicon, germanium, silicon germanium, SOI, SGOI, or combinations thereof. The substrate core 162 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 162.

The substrate core 162 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 162 may also include metallization layers and vias (not shown), with the bond pads 164 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 162 is substantially free of active and passive devices.

In addition, the package structure P1 further includes a plurality of first conductive connectors 138. In some embodiments, the first conductive connectors 138 are reflowed to attach the first package component 130 to the bond pads 164. The first conductive connectors 138 electrically and/or physically couple the circuit substrate 160, including metallization layers in the substrate core 162, to the first package component 130. In some embodiments, a solder resist (not shown) is formed on the substrate core 162. The first conductive connectors 138 may be disposed in openings in the solder resist to be electrically and mechanically coupled to the bond pads 164. The solder resist may be used to protect areas of the substrate core 162 from external damage. Further, an underfill layer 135 is formed to laterally encapsulate the first conductive connectors 138, the thermoelectric cooler 110, and the passive device 120. In some embodiments, the underfill layer 135 may be any acceptable material, such as a polymer, epoxy, molding underfill, or the like. The underfill layer 135 may have a curved sidewall.

As shown in FIG. 2, the second package component 150 may bonded onto the first package component 130 by a plurality of second conductive connectors 148. The second package component 150 may include, for example, a substrate 142 and one or more stacked dies 154A and 154B coupled to the substrate 142. Although one set of stacked dies 154A and 154B is illustrated, in other embodiments, a plurality of sets of stacked dies may be disposed side-by-side coupled to a same surface of the substrate 142. The substrate 142 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 142 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 142 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 142.

The substrate 142 may include active and passive devices (not shown). A wide variety of devices such as transistors, capacitors, resistors, combinations of these, and the like may be used to generate the structural and functional requirements of the design for the second package components 150. The devices may be formed using any suitable methods.

The substrate 142 may also include metallization layers (not shown) and the conductive vias 144. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 142 is substantially free of active and passive devices.

The substrate 142 may have bond pads 152 on a first side of the substrate 142 to couple to the stacked dies 154A, 154B, and bond pads 146 on a second side of the substrate 142, the second side being opposite the first side of the substrate 142, to couple to the conductive connectors 152. In some embodiments, the bond pads 152 and 146 are formed by forming recesses (not shown) into dielectric layers (not shown) on the first and second sides of the substrate 142. The recesses may be formed to allow the bond pads 152 and 146 to be embedded into the dielectric layers. In other embodiments, the recesses are omitted as the bond pads 152 and 146 may be formed on the dielectric layer. In some embodiments, the bond pads 152 and 146 include a thin seed layer (not shown) made of copper, titanium, nickel, gold, palladium, the like, or a combination thereof. The conductive material of the bond pads 152 and 146 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 152 and 146 is copper, tungsten, aluminum, silver, gold, the like, or a combination thereof.

In some embodiments, the bond pads 152 and the bond pads 146 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 152 and 146. Any suitable materials or layers of material that may be used for the bond pads 152 and 146 are fully intended to be included within the scope of the current application. In some embodiments, the conductive vias 144 extend through the substrate 142 and couple at least one of the bond pads 152 to at least one of the bond pads 146.

In the illustrated embodiment, the stacked dies 154A and 154B are coupled to the substrate 142 by wire bonds 156 although other connections may be used, such as conductive bumps. In an embodiment, the stacked dies 154A and 154B are stacked memory dies. For example, the stacked dies 154A and 154B may be memory dies such as low-power (LP) double data rate (DDR) memory modules, such as LPDDR1, LPDDR2, LPDDR3, LPDDR4, or the like memory modules.

The stacked dies 154A and 154B and the wire bonds 156 may be encapsulated by a molding material 158. The molding material 158 may be molded on the stacked dies 154A, 154B and the wire bonds 156, for example, using compression molding. In some embodiments, the molding material 158 is a molding compound, a polymer, an epoxy, silicon oxide filler material, the like, or a combination thereof. A curing process may be performed to cure the molding material 158; the curing process may be a thermal curing, a UV curing, the like, or a combination thereof.

In some embodiments, the stacked dies 154A, 154B and the wire bonds 156 are buried in the molding material 158, and after the curing of the molding material 158, a planarization step, such as a grinding, is performed to remove excess portions of the molding material 158 and provide a substantially planar surface for the second package components 150.

After the second package components 150 are formed, the second package components 150 are mechanically and electrically bonded to the first package component 130 by the second conductive connectors 148. In some embodiments, the stacked dies 154A and 154B may be coupled to the die 100 through the wire bonds 156, the bond pads 152 and 146, the conductive vias 144, the second conductive connectors 148, the second RDL structure 102, the TIVs 105, and the first RDL structure 132. Further, an underfill layer 145 is formed to laterally encapsulate the second conductive connectors 148 and the second package components 150, thereby reducing stress and protecting the joints resulting from the reflowing of the second conductive connectors 148. In some embodiments, the underfill layer 145 may be any acceptable material, such as a polymer, epoxy, molding underfill, or the like. The underfill layer 145 may have a curved sidewall. In some embodiments, an area within an outermost perimeter of the first package component 130 is greater than an outermost perimeter of the second package components 150 in a plan view.

Figure 6:
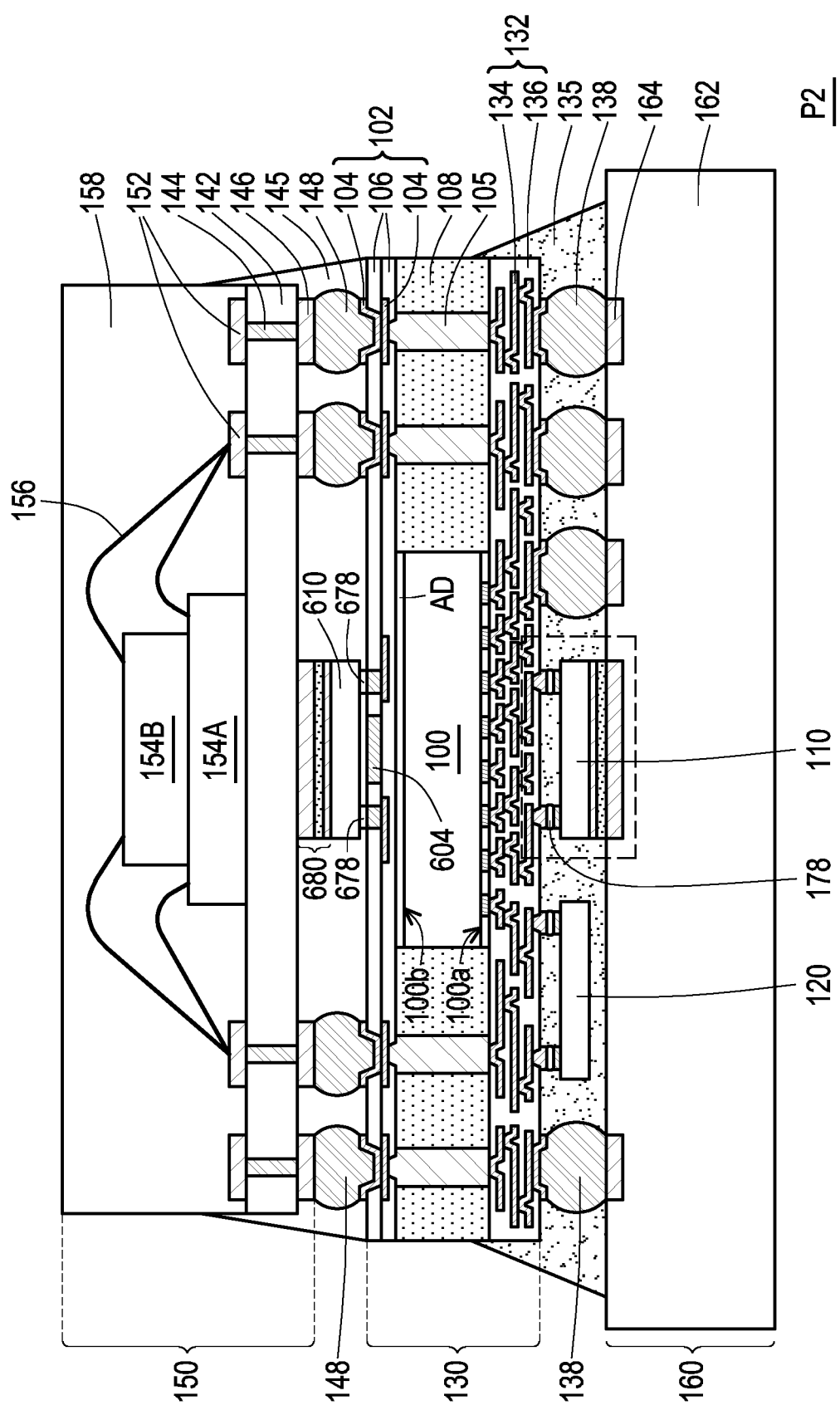
FIG. 6 is a cross-sectional view of a package structure in accordance with a second embodiment.

FIG. 6 is a cross-sectional view of a package structure P2 in accordance with a second embodiment.

Referring to FIG. 6, the package structure P2 of the second embodiment is similar to the package structure P1 of the first embodiment. That is, the configuration and material of the package structure P2 are similar to the configuration and material of the package structure P1 and have been described in detail in the above embodiments. Thus, details thereof are omitted here. A main difference therebetween lies in that the package structure P2 further includes additional thermoelectric cooler 610 disposed between the first package component 130 and the second package component 150. Specifically, the thermoelectric cooler 610 may be bonded onto the underlying package component 130 by two joints 678, and may be bonded to the overlying package component 150 by an adhesive structure 680. The configuration and function of the thermoelectric cooler 610 is similar to those of the thermoelectric cooler 110, thus, the details thereof are omitted here. It should be noted that when the voltage is applied across the thermoelectric cooler 610, a temperature gradient is formed between the top surface and the bottom surface of the thermoelectric cooler 610. That is, the bottom surface of the thermoelectric cooler 610 close to the die 100 is cooled and the top surface of the thermoelectric cooler 610 away from the die 100 is heated. In such embodiment, the heat generated from the die 100 may initiatively flow to the second package component 150 through the thermoelectric cooler 610 and the adhesive structure 680. The configuration and function of the adhesive structure 680 is similar to those of the adhesive structure 180, thus, the details thereof are omitted here. In addition, the package structure P2 further includes a metal mesh (e.g., copper mesh) 604 embedded in the second RDL structure 102. The metal mesh 604 may correspond the die 100. As such, the metal mesh 604 can also transfer the heat generated by the die 100 to reduce the temperature of the die 100 for heat dissipation. In such embodiment, the metal mesh 604 may be electrically floating or electrically isolated from other elements.

Figure 7:
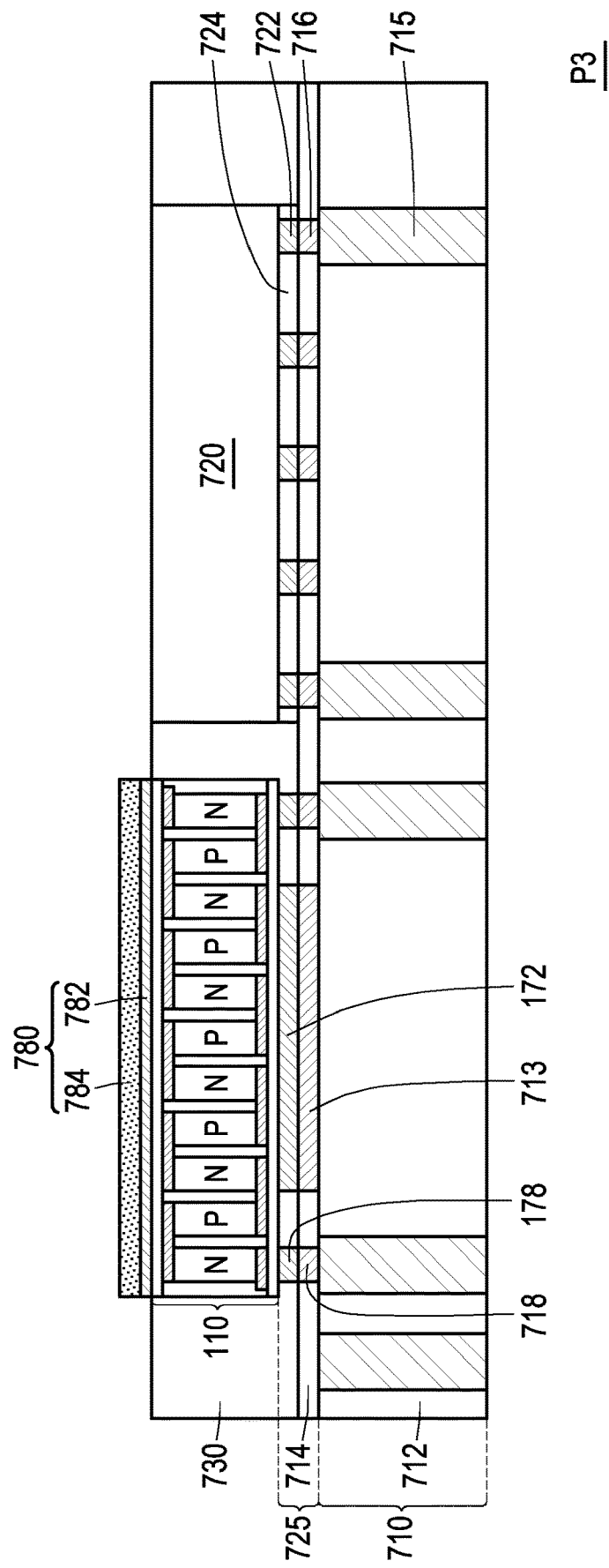
FIG. 7 is a cross-sectional view of a package structure in accordance with a third embodiment.

FIG. 7 is a cross-sectional view of a package structure P3 in accordance with a third embodiment.

Referring to FIG. 7, the package structure P3 may include a first die 710, and a second die 720 and the thermoelectric cooler 110 stacked on the first die 710. Herein, the package structure P3 may be referred to as a 3D integrated circuit (IC) package structure such as, for example, a system on integrated chip (SoIC) package structure. In some embodiments, the first die 710 may be or include a logic die, such as a central processing unit (CPU) die, a graphic processing unit (GPU) die, a micro control unit (MCU) die, an input-output (I/O) die, a baseband (BB) die, or an application processor (AP) die. Specifically, the first die 710 may include a substrate 712, a plurality of through-substrate vias (TSVs) 715, a dielectric layer 714, and a plurality of bond pads 716. The dielectric layer 714 may be disposed on the substrate 712, and the bond pads 716 may be embedded in the dielectric layer 714. In addition, the TSVs 715 may penetrate through the substrate 712 to contact the bond pads 716. In some embodiments, the TSVs 715 may has tapered sidewalls in a cross-sectional view.

In some embodiments, the second die 720 may be different from the first die 710. For example, the second die 720 may be a memory die, such as dynamic random-access memory (DRAM) die, static random-access memory (SRAM) die, hybrid memory cube (HMC) module, high bandwidth memory (HBM) module, or the like. The second die 720 may be bonded onto the first die 710 through a directly bonding method. Specifically, the second die 720 may have a plurality of bond pads 722. In some embodiments, before the second die 720 is bonded to the first die 710, the bond pads 722 are aligned with the bond pads 716 by using an optical sensing method. After the alignment is achieved, the bond pads 722 are in direct contact with the bond pads 716 and then bonded together by the application of pressure and heat. In this case, the bonding of the bond pads 722 bonded to the bond pads 716 may be referred to as a metal-to-metal bonding or directly bonding. In some embodiments, the sidewall of the bond pads 722 may be laterally offset from the sidewall of the bond pads 716, so that a portion of the bond pads 722 may be in contact with the dielectric layer 714.

Similarly, the thermoelectric cooler 110 may be bonded onto the first die 710 through a directly bonding method. Specifically, the thermoelectric cooler 110 may have the joints 178 and the metal layer 172. In some embodiments, the joints 178 are in direct contact with the bond pads 718, and the metal layer 172 is in direct contact with the bond plate 713. Next, the joints 178 and the metal layer 172 are respectively bonded to the bond pads 718 and the bond plate 713 by the application of pressure and heat. In this case, the bonding of the joints 178 bonded to the bond pads 718 and/or the metal layer 172 bonded to the bond plate 713 may be referred to as a metal-to-metal bonding or directly bonding. That is, the second die 720 and the thermoelectric cooler 110 may bonded onto the first die 710 by a bonding structure 725 which includes a bonding metal structure (178/718), a bonding metal structure (172/713), and a bonding metal structure (722/716). In some alternative embodiments, the bonding structure 725 may be a hybrid bonding structure which the second die 720 has a dielectric layer 724 surrounding the bond pads 722, and the dielectric layer 724 may be bonded to the dielectric layer 714 by a dielectric-to-dielectric bonding.

It should be noted that when the voltage is applied across the thermoelectric cooler 110, a temperature gradient is formed between the top surface and the bottom surface of the thermoelectric cooler 110. That is, the bottom surface of the thermoelectric cooler 110 close to the first die 710 is cooled and the top surface of the thermoelectric cooler 110 away from the first die 710 is heated. In such embodiment, the thermoelectric cooler 110 can actively dissipate the heat generated from the first die 710.

In addition, the package structure P3 further includes an encapsulant 730 laterally encapsulating the second die 720 and the thermoelectric cooler 110. In some embodiments, the encapsulant 730 includes a molding compound, a molding underfill, a resin (such as an epoxy resin), or a combination thereof, or the like. The encapsulant 730 may be formed by a sequence of an over-molding process and a planarizing process such as CMP process. Further, the thermoelectric cooler 110 may include an adhesive structure 780 including a metal layer 782 and a TIM 784 on the metal layer 782. The thermoelectric cooler 110 may be thermally coupled to additional RDL structure or circuit substrate through the adhesive structure 780.

Figure 8:
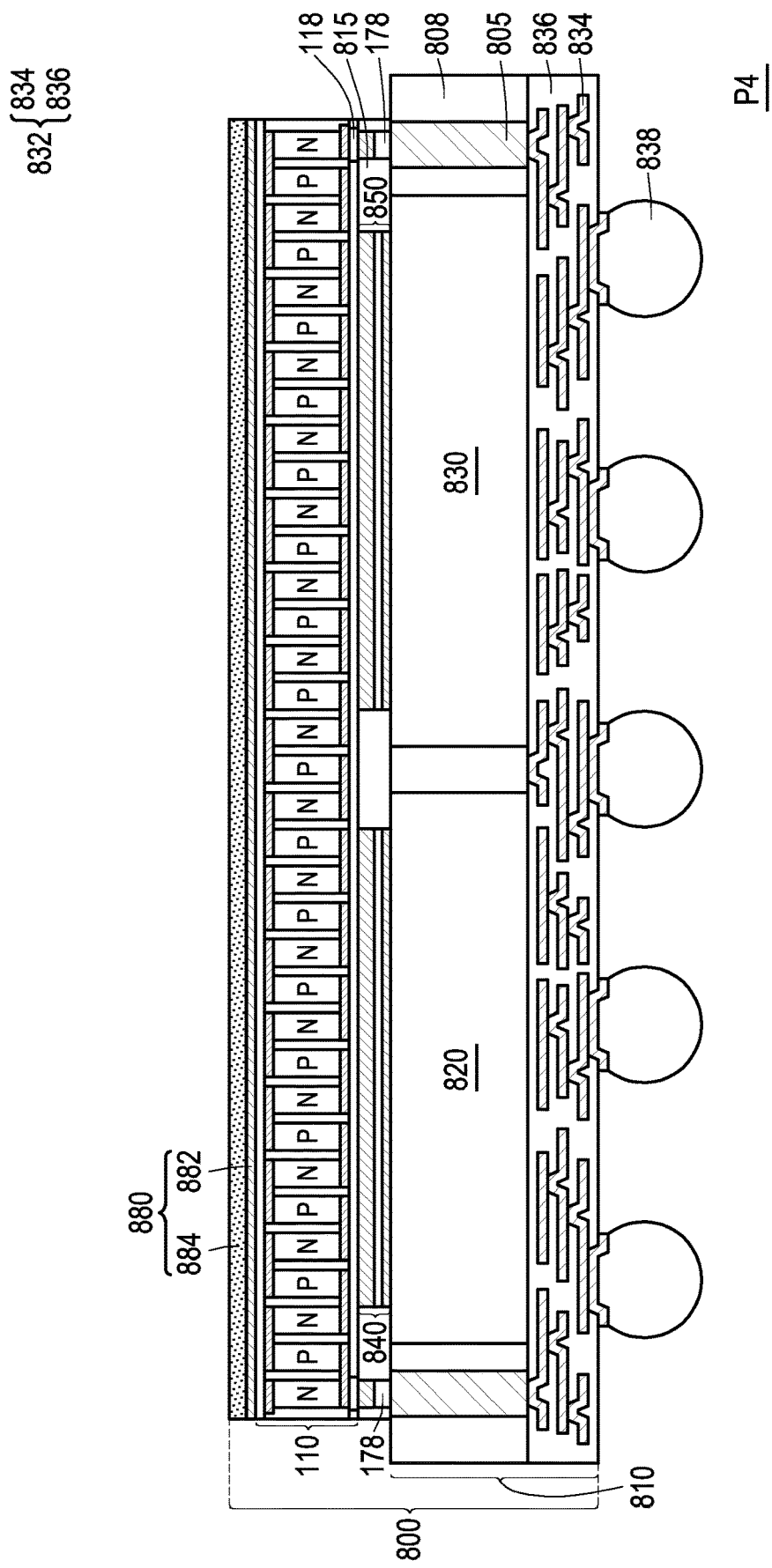
FIG. 8 is a cross-sectional view of a package structure in accordance with a fourth embodiment.

FIG. 8 is a cross-sectional view of a package structure P4 in accordance with a fourth embodiment.

Referring to FIG. 8, the package structure P4 may include the thermoelectric cooler 110, a package 810, a first adhesive structure 840, and a second adhesive structure 850. The package 810 may include a first die 820 and a second die 830 disposed side by side on a RDL structure 832, and a first encapsulant 808 on the RDL structure 832 to laterally encapsulate the first die 820 and the second die 830. The first die 820 is thermally coupled to the thermoelectric cooler 110 by the first adhesive structure 840, and the second die 830 is thermally coupled to the thermoelectric cooler 110 by the second adhesive structure 850. Herein, the package 810 may be referred to as an Integrated Fan-Out (InFO) package. In such embodiment, the first dimension D1 (FIG. 3C) of the thermoelectric cooler 110 may be in a range of 0.5 mm to 10 mm, the second dimension D2 (FIG. 3C) of the thermoelectric cooler 110 may be in a range of 0.5 mm to 1.5 mm, and the thickness T1 (FIG. 3A) of the thermoelectric cooler 110 may be in a range of 0.08 mm to 0.15 mm. However, the embodiments of the present invention are not limited thereto. The size of the thermoelectric cooler 110 may be adjusted based on chip design.

The RDL structure 832 may include a plurality of conductive features 834 embedded in a dielectric layer 836. In some embodiments, the conductive features 834 include a plurality of traces and vias (not shown) stacked alternately. The material and forming method of the conductive features 834 and the dielectric layer 836 are similar to the material and forming method of the conductive features 104 and the dielectric layer 106 illustrated in above embodiments. Thus, details thereof are omitted here. In some alternative embodiments, the RDL structure 832 may be referred to as an interposer when the package component 800 is a chip-on-wafer-on-substrate (CoWoS) package.

The package structure P4 further includes the first encapsulant 808, a plurality of TIVs 805, and a second encapsulant 815. The first encapsulant 808 may be disposed on the RDL structure 834 to laterally encapsulate the first die 820, the second die 830, and the TIVs 805. In some embodiments, the encapsulant 808 may have a sidewall aligned with a sidewall of the RDL structure 832. The second encapsulant 815 may be disposed on the first encapsulant 808, the first die 820, and the second die 830 to laterally encapsulate the first adhesive structure 840 and the second adhesive structure 850.

In some embodiments, the first adhesive structure 840 and the second adhesive structure 850 each includes a TIM between two metal layers. The configuration and material of the first adhesive structure 840 and the second adhesive structure 850 are similar to the configuration and material of the adhesive structure 180 illustrated in above embodiments. Thus, details thereof are omitted here.

In some embodiments, the thermoelectric cooler 110 may have the joints 178 in direct contact with the TIVs 805 for providing the electrical power. It should be noted that when the voltage is applied across the thermoelectric cooler 110, a temperature gradient is formed between the top surface and the bottom surface of the thermoelectric cooler 110. That is, the bottom surface of the thermoelectric cooler 110 close to the first die 820 and the second die 830 is cooled and the top surface of the thermoelectric cooler 110 away from the first die 820 and the second die 830 is heated. In such embodiment, the thermoelectric cooler 110 can actively dissipate the heat generated from the first die 820 and the second die 830.

In addition, the thermoelectric cooler 110 may include an adhesive structure 880 including a metal layer 882 and a TIM 884 on the metal layer 882. The thermoelectric cooler 110 may be thermally coupled to additional lid or heat sink through the adhesive structure 880. Further, a plurality of conductive connectors 838 may be formed on the bottom surface of the RDL structure 832. In some embodiments, a package component 800 may be bonded to additional RDL structure or circuit substrate through the conductive connectors 838.

Figure 9:
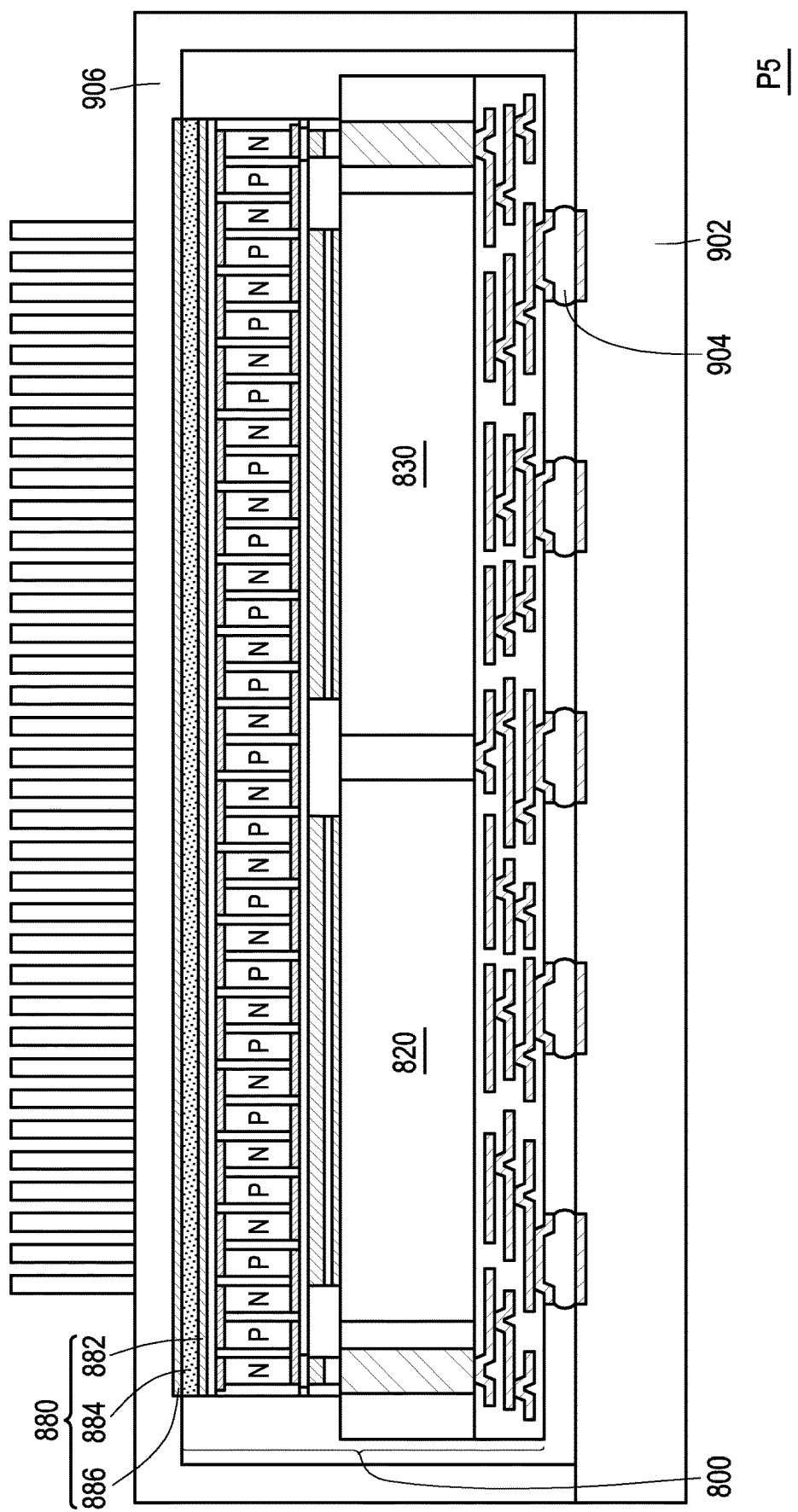
FIG. 9 is a cross-sectional view of a package structure in accordance with a fifth embodiment.

FIG. 9 is a cross-sectional view of a package structure P5 in accordance with a fifth embodiment.

Referring to FIG. 9, the package component 800 is as in FIG. 8, except that the RDL structure 832 is replaced by an interposer (hereinafter called "interposer 832"). In such embodiment, the package structure P5 may be referred to as a CoWoS package structure.

The package component 800 may bonded onto the circuit substrate 902 by a plurality of conductive connectors 904. In some embodiments, the conductive connectors 904 are electrically and/or physically connected to the circuit substrate 902. The conductive connectors 904 may be BGA connectors, solder balls, metal pillars, controlled collapse chip connection (C4) bumps, micro bumps, electroless nickel-electroless palladium-immersion gold technique (ENEPIG) formed bumps, or the like. In the present embodiment, the conductive connectors 904 are micro bumps having a solder paste sandwiched between two metal posts. In some embodiments, the conductive connectors 904 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

The package structure P5 further includes a lid 906 and a heat dissipation fin 908. In some embodiments, the lid 906 is attached to the circuit substrate 902 through an adhesive structure 880 including a TIM 884 between two metal layers 882 and 886. As shown in FIG. 9, the lid 906 may cover and surround the package component 800. In some embodiments, the lid 906 is formed from a material with high thermal conductivity (k), such as steel, stainless steel, copper, the like, or combinations thereof. In some alternative embodiments, the lid 906 is coated with another metal, such as gold, nickel, or the like. In some other embodiments, the lid 906 is a single contiguous material. In another embodiment, the lid 906 includes multiple pieces that may be the same or different materials. The heat dissipation fin 908 may be optionally disposed on the lid 906 to further dissipate heat. In some embodiments, the heat dissipation fin 908 is formed from a material with high thermal conductivity (k), such as steel, stainless steel, copper, the like, or combinations thereof. The heat dissipation fin 908 and the lid 906 may have the same material or different materials.

Figure 10:
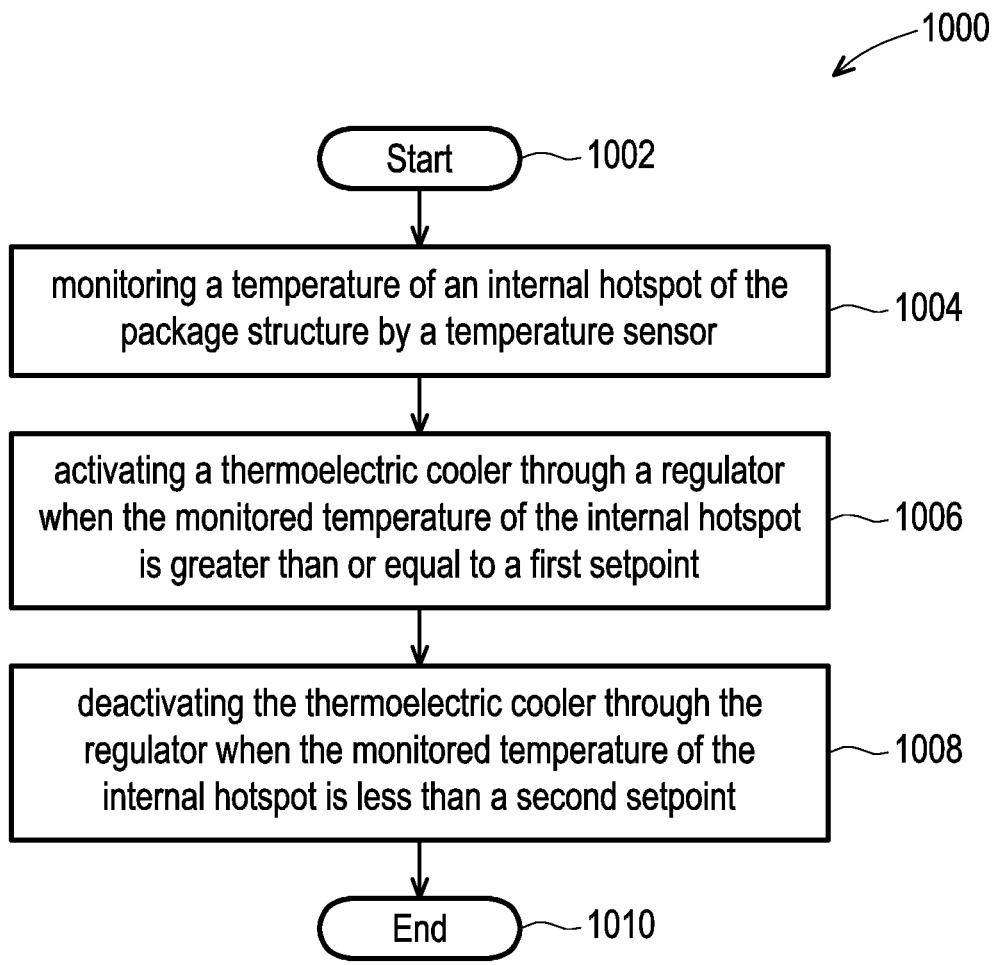
FIG. 10 is a flow diagram of a method of cooling a package structure in accordance with some embodiments.

FIG. 10 is a flow diagram of a method of cooling a package structure in accordance with some embodiments.

A method 1000 of cooling a package structure is further provided. FIG. 10 is a flow diagram of a method 1000 of cooling the package structure (P1, P2, P3, P4, or P5) in accordance with some embodiments of the present disclosure. The process begins at block 1002. At block 1004 a temperature of a package structure is monitored. In some embodiments, the temperature is monitored at an internal location of the package structure by using a temperature monitor disposed within the package structure (e.g., the logic die). In some embodiments, the temperature monitor is implemented as a temperature sensor or a thermal detector circuit. In some embodiments, the temperature is monitored at predetermined intervals.

At block 1006, a thermoelectric cooler is activated through a regulator when the monitored temperature of the internal hotspot is greater than or equal to a first setpoint. In some embodiments, the thermoelectric cooler is connected to the package structure via one or more jointer. A voltage may be applied across a plurality of N-type doped regions and a plurality of P-type doped regions connected to each other in series of the thermoelectric cooler through the joints, thereby forming a temperature gradient across a first surface and a second surface of the thermoelectric cooler opposite to each other. In this case, the temperature of the internal hotspot may be actively reduced by the thermoelectric cooler. In some embodiments, the temperature gradient may be in a range of 68° C. to 70° C. That is, the temperature of the internal hotspot may be reduced by 68° C. to 70° C. In addition, the temperature fluctuation of the internal hotspot (i.e., logic die) may keep within 0.1° C. by the regulator (e.g., pulse width modulation). In some embodiments, the thermoelectric cooler is activated or energized at the first predetermined interval when the temperature monitor indicates an internal temperature of the package structure is greater than or equal to a first setpoint. In some embodiments the first setpoint is set below the design temperature threshold of a limiting component of the package structure. In some embodiments the first setpoint is predetermined; in other embodiments, the first setpoint is determined dynamically.

At block 1008, the thermoelectric cooler is deactivated (i.e., secured or de-energized) through the regulator when the monitored temperature of the internal hotspot is less than a second setpoint. In some embodiments, the thermoelectric cooler is deactivated or secured at the first predetermined interval when the temperature monitor indicates an internal temperature of the package structure less than the second setpoint. The process ends at block 1010.

The present disclosure of a thermoelectric cooler in combination with a package structure has several advantages. The thermoelectric cooler may provide one or more heat release aisles for high performance device. In this case, the high-performance device can achieve better temperature control during high-speed calculation. The thermoelectric cooler may be applied on various package structures to actively remove heat generated by the logic die used for high-speed calculation, thereby improving the performance and reliability of the package structures.

According to some embodiments, a package structure includes: a first redistribution layer (RDL) structure, having a first side and a second side opposite to each other; a die, disposed on the first side of the first RDL structure; a circuit substrate, bonded to the second side of the first RDL structure through a plurality of first conductive connectors; and a first thermoelectric cooler, between the first RDL structure and the circuit substrate, wherein the first thermoelectric cooler comprises at least a N-type doped region and at least a P-type doped region.

According to some embodiments, a package structure includes: a package, comprising a first die and a second die disposed side by side; a thermoelectric cooler, overlying the package, wherein the thermoelectric cooler comprises at least a N-type doped region and at least a P-type doped region; and a first adhesive structure, disposed between the first die and a bottom surface of the thermoelectric cooler.

According to some embodiments, a package structure includes: a first die; and a second die and a thermoelectric cooler, disposed side by side and on the first die, wherein the thermoelectric cooler comprises at least a N-type doped region and at least a P-type doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a first redistribution layer (RDL) structure, having a first side and a second side opposite to each other;
    a die, disposed on the first side of the first RDL structure;
    a circuit substrate, bonded to the second side of the first RDL structure through a plurality of first conductive connectors;
    a first thermoelectric cooler, between the first RDL structure and the circuit substrate, wherein the first thermoelectric cooler comprises at least a N-type doped region and at least a P-type doped region,
    wherein the first thermoelectric cooler is bonded onto the second side of the first RDL structure by a first adhesive structure, the first adhesive structure comprises a first thermal interface material (TIM) sandwiched between two first metal layers, and the two first metal layers are electrically floating;
    a passive device disposed aside the first thermoelectric cooler and between the first RDL structure and the circuit substrate; and
    a first underfill layer, laterally encapsulating the plurality of first conductive connectors, the passive device, and the first thermoelectric cooler, and continuously extending among the plurality of first conductive connectors, the passive device, and the first thermoelectric cooler.

2. The package structure of claim 1, wherein the first thermoelectric cooler comprises: a plurality of N-type doped regions and a plurality of P-type doped regions connected to each other in series, wherein the first thermoelectric cooler is configured to form a temperature gradient across the first RDL structure and the circuit substrate when a voltage is applied across the plurality of N-type doped regions and the plurality of P-type doped regions.

3. The package structure of claim 2, further comprising:
    two joints, bonding the first thermoelectric cooler to the second side of the first RDL structure, and configured to apply the voltage across the plurality of N-type doped regions and the plurality of P-type the doped region; and
    wherein the first adhesive structure, disposed between the two joints to thermally couple the die to the first thermoelectric cooler.

4. The package structure of claim 3, wherein the two joints are respectively disposed at two corners of a perimeter of the first thermoelectric cooler, and are arranged in a diagonal direction in the top view.

5. The package structure of claim 2, wherein the plurality of N-type doped regions and the plurality of P-type doped regions of the first thermoelectric cooler in the top view are arranged in a checkerboard pattern.

6. The package structure of claim 1, further comprising:
    a second adhesive structure, disposed below the first thermoelectric cooler to thermally couple the first thermoelectric cooler to the circuit substrate, wherein the second adhesive structure comprises a second TIM sandwiched between two second metal layers, and the two second metal layers are electrically floating.

7. The package structure of claim 1, further comprising:
    an encapsulant, laterally encapsulating the die;
    a second RDL structure, disposed on the die and the encapsulant;
    a package, bonded to the second RDL structure through a plurality of second conductive connectors;
    a second thermoelectric cooler, vertically disposed between the package and the second RDL structure; and
    a second underfill layer, laterally encapsulates the plurality of second conductive connectors, the second thermoelectric cooler, and the package, and continuously extending among the plurality of second conductive connectors, the second thermoelectric cooler, and the package.

8. A package structure, comprising:
    a package, comprising:
        a first die and a second die disposed side by side on an interposer; and
        a first encapsulant, disposed on the interposer and laterally encapsulating the first die and the second die;
    a thermoelectric cooler, overlying the package and across the first die and the second die, wherein the thermoelectric cooler comprises at least a N-type doped region and at least a P-type doped region;
    a first adhesive structure, disposed between the first die and a bottom surface of the thermoelectric cooler, wherein the first adhesive structure comprises: a first thermal interface material (TIM) sandwiched between two first metal layers and directly and continuously contacting the two first metal layers, the first die is thermally coupled to the thermoelectric cooler through the first adhesive structure;
    a second adhesive structure, disposed between the second die and the bottom surface of the thermoelectric cooler; and
    a second encapsulant, disposed between the first encapsulant and the bottom surface of the thermoelectric cooler to laterally encapsulate and be sandwiched between sidewalls of the first adhesive structure and the second adhesive structure.

9. The package structure of claim 8, wherein the interposer comprises:
    a redistribution layer (RDL) structure.

10. The package structure of claim 8, wherein the second adhesive structure comprises: a second TIM sandwiched between two second metal layers and directly and continuously contacting two second metal layers, and the second die is thermally coupled to the thermoelectric cooler through the second adhesive structure.

11. The package structure of claim 8, further comprising:
    a circuit substrate, bonded to the package; and
    a lid, adhered to the circuit substrate and the thermoelectric cooler, wherein the lid covers and surrounds the package and the thermoelectric cooler.

12. The package structure of claim 11, further comprising:
a heat dissipation fin, disposed on the lid.

13. The package structure of claim 11, wherein the lid is adhered to the thermoelectric cooler through a third adhesive structure, the third adhesive structure comprises a third TIM sandwiched between two third metal layers, and the thermoelectric cooler is thermally coupled to the heat dissipation fin through the third adhesive structure.

14. The package structure of claim 8, wherein the thermoelectric cooler comprises: a plurality of N-type doped regions and a plurality of P-type doped regions connected to each other in series, the thermoelectric cooler is configured to form a temperature gradient across a top surface and a bottom surface of the thermoelectric cooler when a voltage is applied across the plurality of N-type doped regions and the plurality of P-type doped regions, wherein the plurality of N-type doped regions and the plurality of P-type doped regions of the thermoelectric cooler in the top view are arranged in a checkerboard pattern.

15. The package structure of claim 8, wherein the second encapsulant has a second sidewall laterally recessed from a first sidewall of the first encapsulant.

16. The package structure of claim 8, wherein the second encapsulant is not in direct contact with a sidewall of the first encapsulant.

17. A package structure, comprising:
- a first package component, bonded to a circuit substrate through a plurality of first conductive connectors;
- a thermoelectric cooler, horizontally arranged aside the plurality of first conductive connectors and vertically sandwiched between the first package component and the circuit substrate; and
- a first underfill layer, laterally encapsulating the plurality of first conductive connectors and the thermoelectric cooler, and continuously extending between the plurality of first conductive connectors and the first thermoelectric cooler, wherein the first underfill layer further extends to cover a lower sidewall of the first package component.

18. The package structure of claim 17, wherein the thermoelectric cooler comprises: a plurality of N-type doped regions and a plurality of P-type doped regions connected to each other in series, the thermoelectric cooler is configured to form a temperature gradient across a top surface and the bottom surface of the thermoelectric cooler when a voltage is applied across the plurality of N-type doped regions and the plurality of P-type doped regions.

19. The package structure of claim 17, wherein the first package component comprises:
- a die, vertically disposed between a first RDL structure and a second RDL structure; and
- an encapsulant, laterally encapsulating the die,
- wherein the first thermoelectric cooler is bonded onto the first RDL structure by a first adhesive structure, and bonded onto the circuit substrate by a second adhesive structure.

20. The package structure of claim 19, further comprising:
- a second package component, bonded to the second RDL structure through a plurality of second conductive connectors; and
- a second underfill layer, laterally encapsulating the plurality of second conductive connectors, and continuously extending between the plurality of second conductive connectors, wherein the second underfill layer further extends to cover a lower sidewall of the second package component.

* * * * *